(12) United States Patent
Tominaga et al.

(10) Patent No.: US 6,967,985 B2
(45) Date of Patent: Nov. 22, 2005

(54) SURFACE EMISSION SEMICONDUCTOR LASER DEVICE

(75) Inventors: Koji Tominaga, Hirakata (JP); Kazushi Mori, Hirakata (JP); Atsushi Tajiri, Osaka (JP); Yasuhiko Nomura, Moriguchi (JP); Ryoji Hiroyama, Kyo-tanabe (JP)

(73) Assignee: Sanyo Electric Co., Ltd., Osaka (JP)

( * ) Notice: Subject to any disclaimer, the term of this patent is extended or adjusted under 35 U.S.C. 154(b) by 351 days.

(21) Appl. No.: 10/361,618

(22) Filed: Feb. 11, 2003

(65) Prior Publication Data

US 2003/0152121 A1    Aug. 14, 2003

(30) Foreign Application Priority Data

Feb. 12, 2002    (JP)    ............... 2002-033439

(51) Int. Cl.[7] .............................................. H01S 3/08
(52) U.S. Cl. .............................................. 372/98; 372/99
(58) Field of Search ................................. 372/92–99

(56) References Cited

U.S. PATENT DOCUMENTS

| | | | | |
|---|---|---|---|---|
| 5,896,408 A | * | 4/1999 | Corzine et al. | ............... 372/46 |
| 5,978,408 A | * | 11/1999 | Thornton | ............... 372/96 |
| 6,529,541 B1 | * | 3/2003 | Ueki et al. | ............... 372/96 |
| 6,545,335 B1 | * | 4/2003 | Chua et al. | ............... 257/499 |
| 6,577,658 B1 | * | 6/2003 | Lee et al. | ............... 372/45 |
| 6,589,805 B2 | * | 7/2003 | Zhu et al. | ............... 438/22 |
| 6,628,694 B2 | * | 9/2003 | Deng et al. | ............... 372/96 |
| 6,876,687 B2 | * | 4/2005 | Zhu et al. | ............... 372/45 |
| 2002/0075921 A1 | * | 6/2002 | Kitatani et al. | ............... 372/45 |

FOREIGN PATENT DOCUMENTS

| | | |
|---|---|---|
| JP | 1-196884 | 8/1989 |
| JP | 5-55704 | 3/1993 |
| JP | 8-125268 | 5/1996 |
| JP | 8-186328 | 7/1996 |

* cited by examiner

Primary Examiner—Minsun Oh Harvey
Assistant Examiner—Phillip Nguyen
(74) Attorney, Agent, or Firm—McDermott Will & Emery LLP (57) ABSTRACT

A surface emission semiconductor laser device capable of substantially completely controlling the plane of polarization is obtained. This surface emission semiconductor laser device comprises a first multi-layer reflector, an emission layer formed on the first multi-layer reflector and a second multi-layer reflector formed on the emission layer, and at least either the first multi-layer reflector or the second multi-layer reflector includes a striped part worked in a striped manner in a prescribed period.

16 Claims, 6 Drawing Sheets

SURFACE EMISSION SEMICONDUCTOR LASER DEVICE

BACKGROUND OF THE INVENTION

1. Field of the Invention

The present invention relates to a surface emission semiconductor laser device, and more particularly, it relates to a surface emission semiconductor laser device comprising a multi-layer reflector.

2. Description of the Background Art

A surface emission semiconductor laser device of a vertical resonance type has been actively developed in recent years. This surface emission semiconductor laser device, having excellent characteristics such as a low threshold current, high-speed response, easiness in implementation of a two-dimensional array and a low cost, is expected for various applications in the fields of optical communication, optical recording and optical measurement.

In the conventional surface emission semiconductor laser device, however, it is difficult to control the plane of polarization in a prescribed direction since the cavity is concentric with respect to the traveling direction of the laser beam. Therefore, the plane of polarization may unstably switch between two planes of polarization along the <110> and <1–10> crystal orientations of an emission layer. Consequently, it is difficult to stably control the plane of polarization in the conventional surface emission semiconductor laser device. Thus, it is difficult to combine the surface emission semiconductor laser device having the difficulty in stably controlling the plane of polarization with an optical component such as a polarized beam splitter or a polarizer. In optical communication, further, switching of the plane of polarization disadvantageously hinders high-speed modulation.

Various methods have been proposed for stably controlling the plane of polarization of the surface emission semiconductor laser device. For example, Japanese Patent No. 3,123,136 discloses a method of controlling the plane of polarization of a surface emission semiconductor laser device by employing a semiconductor substrate (inclined substrate) having a plane orientation inclined in a specific direction. This method controls the plane of polarization by supplying a high optical gain to the plane of polarization of the specific direction due to anisotropy of the crystal orientation of an emission layer with respect to the direction for emitting a laser beam.

In the aforementioned method disclosed in Japanese Patent No. 3,123,136 capable of improving the optical gain with respect to polarization in a prescribed direction, however, an optical gain with respect to polarization in another direction is not zero and hence the plane of polarization is disadvantageously insufficiently controlled. Further, it is difficult to individually control the planes of polarization of surface emission semiconductor laser devices formed on the same substrate since the plane orientation of the overall substrate is inclined in the specific direction.

SUMMARY OF THE INVENTION

An object of the present invention is to provide a surface emission semiconductor laser device capable of substantially completely controlling the plane of polarization.

Another object of the present invention is to make it possible to individually control the planes of polarization of surface emission semiconductor laser devices formed on the same substrate in relation to the aforementioned surface emission semiconductor laser device.

In order to attain the aforementioned objects, a surface emission semiconductor laser device according to an aspect of the present invention comprises a first multi-layer reflector, an emission layer formed on the first multi-layer reflector and a second multi-layer reflector formed on the emission layer, while at least either the first multi-layer reflector or the second multi-layer reflector includes a striped part worked in a striped shape in a prescribed period. According to the present invention, the term "striped shape" denotes an elongated shape.

In the surface emission semiconductor laser device according to this aspect, at least either the first multi-layer reflector or the second multi-layer reflector is formed to include the striped part worked in a striped shape in a prescribed period as hereinabove described, whereby the reflectance with respect to polarization in a direction parallel to the striped part can be rendered larger than the reflectance with respect to polarization in a direction perpendicular to the striped part. When the ratios between periods and widths of respective material layers forming the multi-layer reflector including the striped part are adjusted in this case, the multi-layer reflector including the striped part can function as a reflecting film only with respect to polarization in the direction parallel to the striped part. Thus, lasing can be made only with polarization in the direction parallel to the striped part, whereby the plane of polarization can be substantially completely controlled. According to this aspect, the planes of polarization of a plurality of surface emission semiconductor laser devices formed on the same substrate can be individually controlled by controlling the directions of striped parts of the surface emission semiconductor laser devices independently of each other.

In the surface emission semiconductor laser device according to the aforementioned aspect, only the second multi-layer reflector may include the striped part. In this case, the striped part may be formed on the second multi-layer reflector with a prescribed depth not reaching the bottom of the second multi-layer reflector.

In the surface emission semiconductor laser device according to the aforementioned aspect, at least either the first multi-layer reflector or the second multi-layer reflector including the striped part preferably includes a first material layer and a second material layer, and the refractive index of the first material layer and the refractive index of the second material layer with respect to polarization in the direction perpendicular to the striped part are preferably substantially equal to each other. According to this structure, the multi-layer reflector including the striped part can function as a reflecting film only with respect to polarization in the direction parallel to the striped part.

In this case, the ratio Wa between the width and the period of the striped part of the first material layer and the ratio Wb between the width and the period of the striped part of the second material layer are preferably so set that the refractive index of the first material layer and the refractive index of the second material layer with respect to polarization in the direction perpendicular to the striped part are substantially equal to each other. In this case, the ratios Wa and Wb are preferably so set that the refractive index of the first material layer and the refractive index of the second material layer with respect to polarization in the direction parallel to the striped part are different from each other. According to this structure, the multi-layer reflector including the striped part can easily function as a reflecting film only with respect to polarization in the direction parallel to the striped part.

In the aforementioned surface emission semiconductor laser device having the first material layer and the second material layer, the refractive index of the first material layer and the refractive index of the second material layer with respect to polarization in the direction parallel to the striped part may be greater than the refractive index of the first material layer and the refractive index of the second material layer with respect to polarization in the direction perpendicular to the striped part.

In the aforementioned surface emission semiconductor laser device having the first material layer and the second material layer, the first material layer and the second material layer consist of $Al_xGa_{1-x}As$ ($0 \leq x \leq 1$) having different Al compositions. When employing such materials, the refractive indices of the first and second material layers with respect to polarization in the direction perpendicular to the striped part can be easily substantially equalized with each other by controlling the ratios Wa and Wb between the widths and the periods of the striped parts in the first and second material layers. In this case, the emission layer may contain $Al_yGa_{1-y}As$ ($0 \leq y \leq 1$). Alternatively, the emission layer may include a single layer selected from a group consisting of an AlGaInP layer, an InGaAs layer, a GaInNAs layer, an InGaAsP layer and a nitride-based semiconductor layer.

In the aforementioned surface emission semiconductor laser device having the first material layer and the second material layer, thicknesses t1 and t2 of the first material layer and the second material layer are preferably set to satisfy t1 (t2)=$\lambda$/4/n1 (n2) assuming that n1 and n2 represent the refractive indices of the first material layer and the second material layer respectively and $\lambda$ represents the lasing wavelength of the emission layer. According to this structure, a multi-layer reflector having high reflectance with respect to polarization in the direction parallel to the striped part can be obtained.

In the surface emission semiconductor laser device according to the aforementioned aspect, the first multi-layer reflector, the emission layer and the second multi-layer reflector are preferably formed on an n-type GaAs (100) substrate, and the striped part is preferably formed to extend along the <011> direction of the n-type GaAs (100) substrate. According to this structure, a multi-layer reflector functioning as a reflecting film only with respect to polarization in a direction parallel to the <011> direction of the n-type GaAs (100) substrate can be obtained.

In the surface emission semiconductor laser device according to the aforementioned aspect, a plurality of surface emission semiconductor laser devices each including the first multi-layer reflector, the emission layer and the second multi-layer reflector are preferably formed on an n-type GaAs (100) substrate, and the striped parts of the plurality of surface emission semiconductor laser devices are preferably formed to extend along the directions of different crystal axes of the n-type GaAs (100) substrate. According to this structure, the planes of polarization of the individual surface emission semiconductor laser devices formed on the same n-type GaAs (100) substrate can be controlled independently of each other.

In the surface emission semiconductor laser device according to the aforementioned aspect, the striped part may be formed on a quadrangular region in plan view, or may be formed on a circular region in plan view.

In the surface emission semiconductor laser device according to the aforementioned aspect, the period of the striped part is preferably shorter than the emission wavelength of the emission layer. According to this structure, diffraction effect in the striped part can be avoided and a multi-layer reflector having high reflectance with respect to polarization in the direction parallel to the striped part can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the accompanying drawings.

Figure 1:
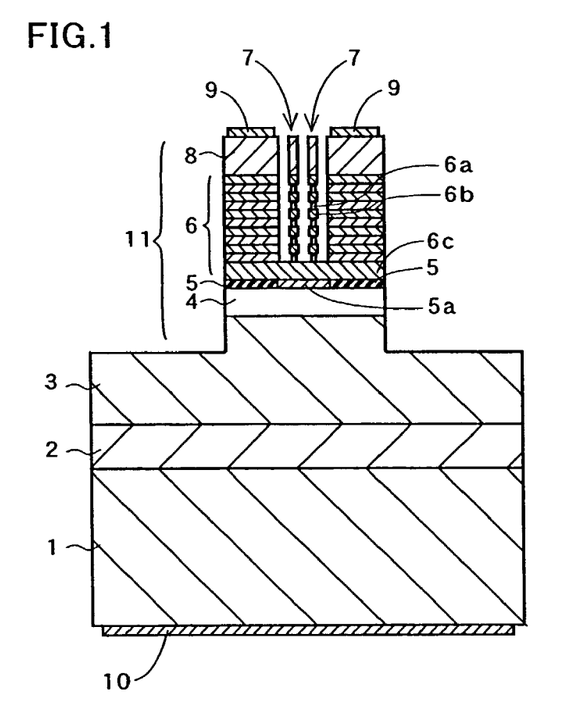
FIG. 1 is a sectional view showing a surface emission semiconductor laser device according to an embodiment of the present invention.
Figure 2:
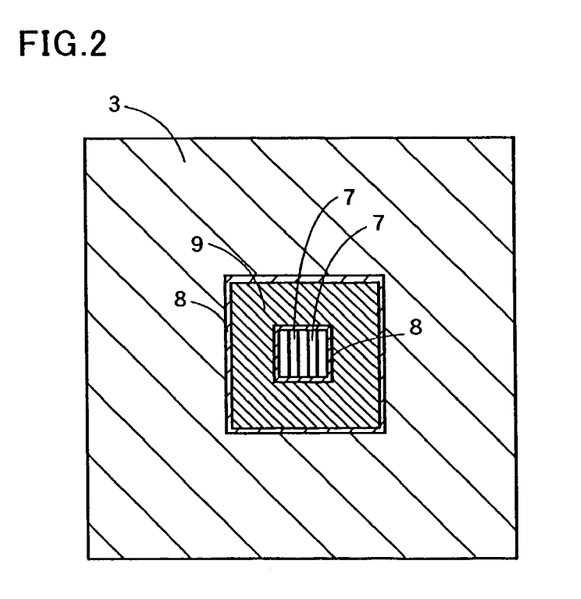
FIG. 2 is a plan view of the surface emission semiconductor laser device according to the embodiment shown in FIG. 1.

First, the structure of a surface emission semiconductor laser device according to this embodiment is described with reference to FIGS. 1 to 4. In the surface emission semiconductor laser device according to this embodiment, an n-type GaAs buffer layer 2 having a thickness of about 100 nm is formed on an n-type GaAs (100) substrate 1, as shown in FIGS. 1 and 2. An n-type multi-layer reflector 3 is formed on the n-type GaAs buffer layer 2 by alternately stacking 32 sets of n-type $Al_{0.12}GaAs$ layers each having a thickness of about 59 nm and n-type $Al_{0.9}GaAs$ layers each having a thickness of about 70 nm. The n-type multi-layer reflector 3 is an example of the "first multi-layer reflector" in the present invention. A square pole-shaped projecting portion of about 30 μm square is formed on the upper surface of the n-type multi-layer reflector 3. An MQW emission layer 4 is formed on the projecting portion of the n-type multi-layer reflector 3 by alternately stacking GaAs layers each having a thickness of about 6 nm and $Al_{0.3}GaAs$ layers each having a thickness of about 8 nm. A low-resistance region 5a consisting of an AlGaAs film is formed on a region of about 3

μm square around the center of the MQW emission layer 4, while a current blocking layer 5 constituted by a high-resistance region consisting of an Al oxide film is formed on a region excluding the low-resistance region 5a. The current blocking layer 5 and the low-resistance region 5a have a thickness of about 30 nm.

A p-type multi-layer reflector 6 is formed on the current blocking layer 5 and the low-resistance region 5a by alternately stacking 20 sets of p-type $Al_{0.12}GaAs$ layers 6a each having a thickness of about 61 nm and p-type $Al_{0.9}GaAs$ layers 6b each having a thickness of about 74 nm. Such p-type $Al_{0.12}GaAs$ layers 6a (not shown) and p-type $Al_{0.9}GaAs$ layers 6b (not shown) are alternately stacked also in a region 6c of the p-type multi-layer reflector 6. The p-type multi-layer reflector 6 is an example of the "second multi-layer reflector" in the present invention.

Figure 3:
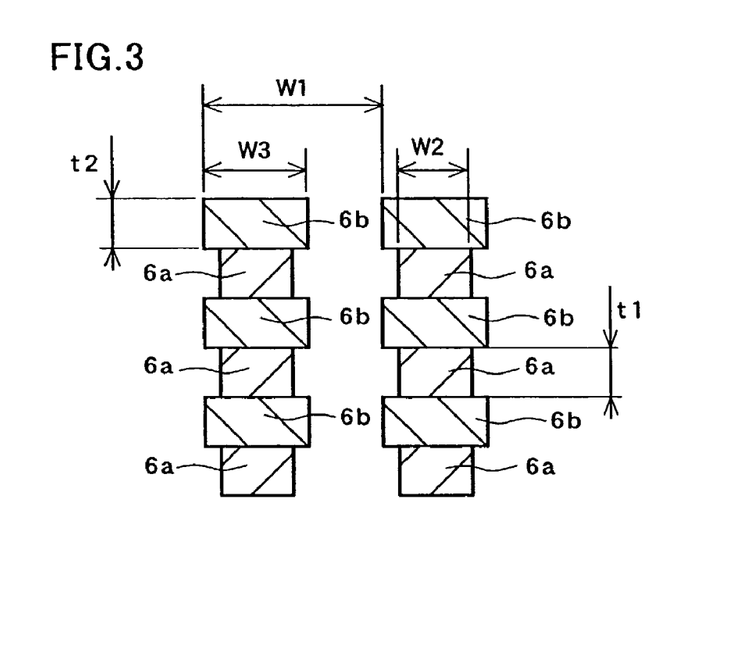
FIG. 3 is an enlarged sectional view of a striped part of a p-type multi-layer reflector in the surface emission semiconductor laser device according to the embodiment shown in FIG. 1.

According to this embodiment, 10 (2 in FIGS. 1 to 3) stripes 7 are formed on the p-type multi-layer reflector 6 in a period of about 0.4 μm. In order to simplify the illustration, FIGS. 1 to 3 show only two stripes 7 of the p-type multi-layer reflector 6. These stripes 7 are described later in detail. A p-type GaAs contact layer 8 having a thickness of about 10 nm is formed on the upper surface of the p-type multi-layer reflector 6. Further, a p-side ohmic electrode 9 is formed on the upper surface of the p-type GaAs contact layer 8 excluding the upper surfaces of the stripes 7. In addition, an n-side ohmic electrode 10 is formed on the back surface of the n-type GaAs (100) substrate 1. The projecting portion of the n-type multi-layer reflector 3, the MQW emission layer 4, the current blocking layer 5 and the low-resistance region 5a, the p-type multi-layer reflector 6 and the p-type GaAs contact layer 8 form a square pole-shaped post portion 11 of the surface emission semiconductor laser device according to this embodiment.

According to this embodiment, the stripes 7 are formed on a quadrangular (square) region of about 4 μm square around the center of the p-type multi-layer reflector 6 with a depth corresponding to the distance between the upper surfaces of the p-type GaAs contact layer 8 and the region 6c to extend in a direction along the <011> direction of the n-type GaAs (100) substrate 1, as shown in FIGS. 1 and 2. As shown in FIG. 3, the 10 (2 in FIG. 3) stripes 7 are formed in a period W1. The period W1 of the stripes 7 is preferably shorter than the lasing wavelength of the MQW emission layer 4, in order to prevent diffraction of light or the like. According to this embodiment, the period W1 is set to about 400 nm (about 0.4 μm) in consideration of the lasing wavelength of 850 nm of the MQW emission layer 4.

According to this embodiment, further, the stripes 7 are so formed as to function as multi-layer reflectors with respect to polarization having a field component parallel to the striped pattern while not functioning as multi-layer reflectors with respect to polarization having a field component perpendicular to the striped pattern. In order to obtain the stripes 7 having such functions, the ratio Wa (W2/W1) between the stripe width W2 in the p-type $Al_{0.12}GaAs$ layers 6a and the period W1 and the ratio Wb (W3/W1) between the stripe width W3 in the p-type $Al_{0.9}GaAs$ layers 6b and the period W1 are set in this embodiment as described below.

Figure 4:
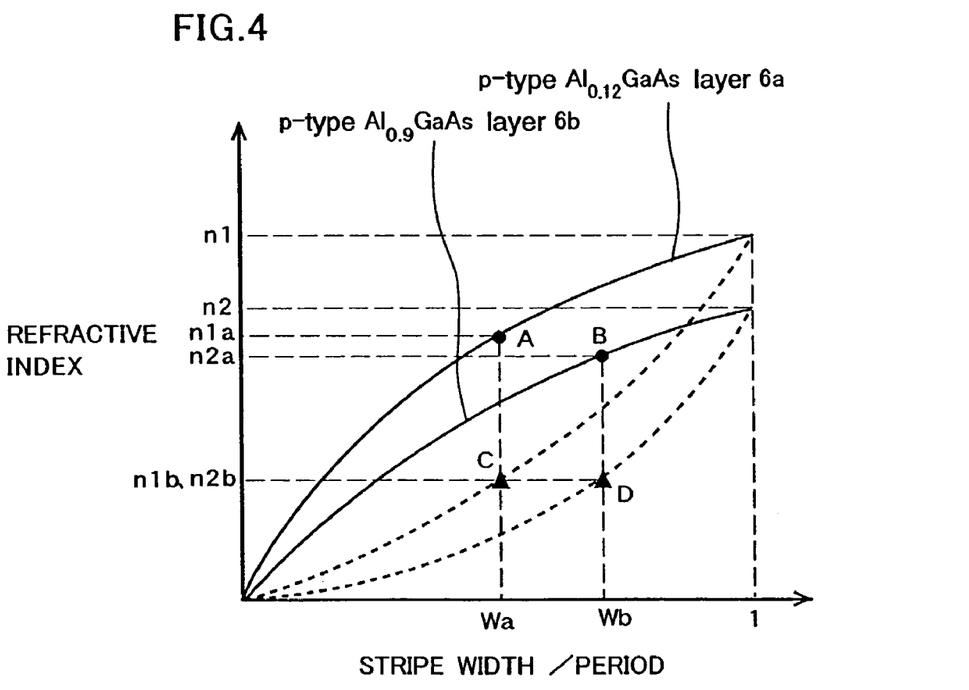
FIG. 4 is a characteristic diagram showing the relation between the ratio between the width and the period of the striped part in the surface emission semiconductor laser device according to the embodiment shown in FIG. 1 and the refractive index of the p-type multi-layer reflector.

The principle of a method of setting the ratios Wa and Wb is now described with reference to FIGS. 3 and 4. When the p-type $Al_{0.12}GaAs$ layers 6a having a refractive index n1 and the p-type $Al_{0.9}GaAs$ layers 6b having a refractive index n2 smaller than the refractive index n1 are stacked with each other, the refractive indices n1 and n2 of the p-type $Al_{0.12}GaAs$ layers 6a and the p-type $Al_{0.9}GaAs$ layers 6b change with the ratios Wa and Wb (Wb>Wa) respectively, as shown in FIG. 4. In this case, a refractive index with respect to polarization parallel to the striped pattern exceeds that with respect to polarization perpendicular to the striped pattern due to anisotropy of the striped pattern of the stripes 7. Referring to FIG. 4, solid lines show change of the effective refractive indices of the p-type multi-layer reflector 6 with respect to polarization parallel to the striped pattern, and broken lines show change of the effective refractive indices of the p-type multi-layer reflector 6 with respect to polarization perpendicular to the striped pattern. AT the ratios Wa and Wb, n1a (point A) denotes the refractive index of the p-type $Al_{0.12}GaAs$ layers 6a with respect to polarization parallel to the striped pattern, n1b (point C) denotes the refractive index of the p-type $Al_{0.12}GaAs$ layers 6a with respect to polarization perpendicular to the striped pattern, n2a (point B) denotes the refractive index of the p-type $Al_{0.9}GaAs$ layers 6b with respect to polarization parallel to the striped pattern, and n2b (point D) denotes the refractive index of the p-type $Al_{0.9}GaAs$ layers 6b with respect to polarization perpendicular to the striped pattern respectively. The ratios Wa and Wb are so set that the refractive indices n1b and n2b at the points C and D reach the same value.

When the ratios Wa and Wb are set in the aforementioned manner, the p-type $Al_{0.12}GaAs$ layers 6a and the p-type $Al_{0.9}GaAs$ layers 6b are stacked with index difference (n1a−n2a) depending on the points A and B shown in FIG. 4. When the p-type $Al_{0.12}GaAs$ layers 6a and the p-type $Al_{0.9}GaAs$ layers 6b are set to proper thicknesses, therefore, the p-type multi-layer reflector 6 functions as a reflecting film with respect to polarization parallel to the striped pattern of the stripes 7 while not functioning as a reflecting film with respect to polarization perpendicular to the striped pattern.

According to the aforementioned principle, the ratios Wa and Wb of the p-type $Al_{0.12}GaAs$ layers 6a and the p-type $Al_{0.9}GaAs$ layers 6b are set to 0.45 and 0.5 respectively in this embodiment. Thus, the effective refractive indices n1a and n2a of the p-type $Al_{0.12}GaAs$ layers 6a and the p-type $Al_{0.9}GaAs$ layers 6b reach 3.51 and 2.88 respectively. In this case, effective index difference is developed between the p-type $Al_{0.12}GaAs$ layers 6a and the p-type $Al_{0.9}GaAs$ layers 6b, whereby the p-type multi-layer reflector 6 functions as a reflecting film with respect to polarization parallel to the striped pattern of the stripes 7. On the other hand, both of the effective refractive indices n1b and n2b of the p-type $Al_{0.12}GaAs$ layers 6a and the p-type $Al_{0.9}GaAs$ layers 6b reach 1.7 with respect to polarization perpendicular to the striped pattern of the stripes 7. In this case, no index difference is developed between the p-type $Al_{0.12}GaAs$ layers 6a and the p-type $Al_{0.9}GaAs$ layers 6b, whereby the p-type multi-layer reflector 6 does not function as a reflecting film with respect to polarization perpendicular to the striped pattern of the stripes 7.

Thicknesses t1 and t2 of the p-type $Al_{0.12}GaAs$ layers 6a and the p-type $Al_{0.9}GaAs$ layers 6b capable of obtaining high reflectance can be calculated according to the following equation (1):

$$t1\ (t2) = \lambda/4/n \tag{1}$$

Referring to the equation (1), λ represents the lasing wavelength of the surface emission semiconductor laser device. The lasing wavelength λ of the surface emission semiconductor laser device according to this embodiment is 850 nm. In the equation (1), further, n represents the effective refractive indices n1a, n1b, n2a and n2b of the p-type $Al_{0.12}GaAs$ layers 6a and the p-type $Al_{0.9}GaAs$ layers 6b.

According to the above equation (1), the thicknesses t1 and t2 of the p-type $Al_{0.12}GaAs$ layers 6a and the p-type $Al_{0.9}GaAs$ layers 6b reach about 61 nm and about 74 nm respectively. Thus, the reflectance of the p-type multi-layer reflector 6 reaches 98% to 99%.

In the surface emission semiconductor laser device according to this embodiment, as hereinabove described, the p-type multi-layer reflector 6 is formed to include the stripes 7 while the ratios Wa and Wb between the period W1 and the widths of the stripes 7 in the p-type $Al_{0.12}GaAs$ layers 6a and the p-type $Al_{0.9}GaAs$ layers 6b forming the p-type multi-layer reflector 6 are so adjusted that the p-type multi-layer reflector 6 can function as a reflecting film only with respect to polarization in the direction parallel to the striped pattern. Consequently, only polarization parallel to the striped pattern of the stripes 7 can be oscillated so that the plane of polarization can be substantially completely controlled.

When a plurality of surface emission semiconductor laser devices according to this embodiment are formed on the same n-type GaAs (100) substrate, the striped patterns of the stripes 7 are extended in different directions so that the planes of polarization of the respective surface emission semiconductor laser devices formed on the same n-type GaAs (100) substrate 1 can advantageously be controlled independently of each other.

FIGS. 5 to 8, 10 and 11 are sectional views for illustrating a fabrication process for the surface emission semiconductor laser device according to the embodiment shown in FIG. 1. FIG. 9 is a plan view in the fabrication process shown in FIG. 8. The fabrication process for the surface emission semiconductor laser device according to this embodiment is now described with reference to FIGS. 1 and 5 to 10.

Figure 5:
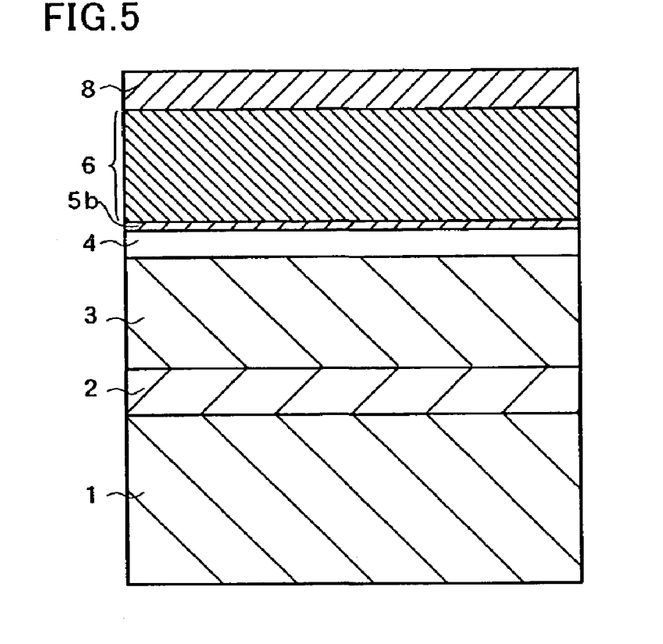
FIGS. 5 to 8 are sectional views for illustrating a fabrication process for the surface emission semiconductor laser device according to the embodiment of the present invention.

First, the n-type GaAs buffer layer 2 having the thickness of about 100 nm is formed on the n-type GaAs (100) substrate 1, as shown in FIG. 5. Then, the 32 sets of the n-type $Al_{0.12}GaAs$ layers each having the thickness of about 59 nm and the n-type $Al_{0.9}GaAs$ layers each having the thickness of about 70 nm are stacked on the n-type GaAs buffer layer 2 thereby forming the n-type multi-layer reflector 3. Thereafter the GaAs layers each having the thickness of about 6 nm and the $Al_{0.3}GaAs$ layers each having the thickness of about 8 nm are stacked on the n-type multi-layer reflector 3 thereby forming the MQW emission layer 4. Then, a p-type AlGaAs layer 5b having a thickness of about 30 nm is formed on the MQW emission layer 4. Thereafter the 20 sets of the p-type $Al_{0.12}GaAs$ layers 6a each having the thickness of about 61 nm and the p-type $Al_{0.9}GaAs$ layers 6b each having the thickness of about 74 nm are stacked on the p-type AlGaAs layer 5b thereby forming the p-type multi-layer reflector 6. Further, the p-type GaAs contact layer 8 having the thickness of about 10 nm is formed on the p-type multi-layer reflector 6.

Figure 6:
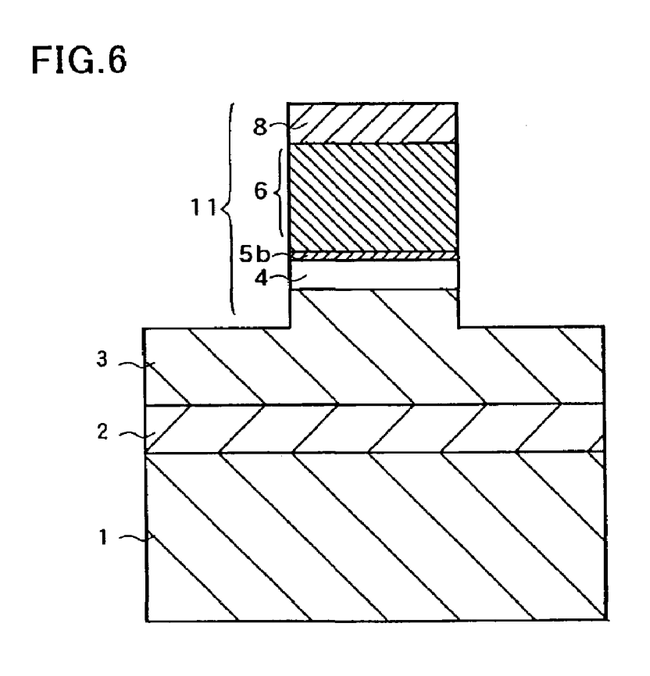
Figure 7:
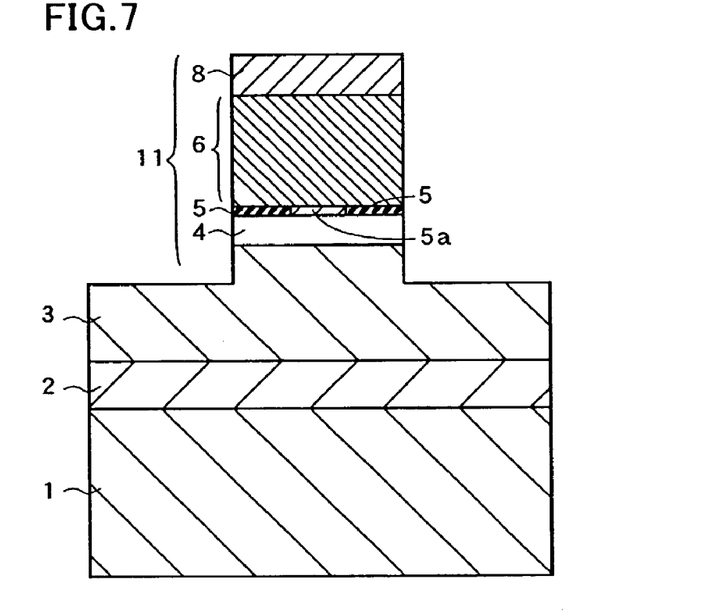

Then, the regions from the p-type GaAs contact layer 8 to the n-type multi-layer reflector 3 are partially removed through photolithography and dry etching thereby forming the post portion 11 having the square pole shape, as shown in FIG. 6. Heat treatment is performed under a vapor atmosphere of about 450° C. for several minutes thereby oxidizing only a peripheral portion of the AlGaAs layer 5b. Thus, the current blocking layer 5 increased in resistance is formed only on the peripheral portion of the AlGaAs layer 5b, as shown in FIG. 7. The low-resistance region 5a forming a current path is formed on a region of about 3 μm square around the center of the AlGaAs layer 5b.

Figure 8:
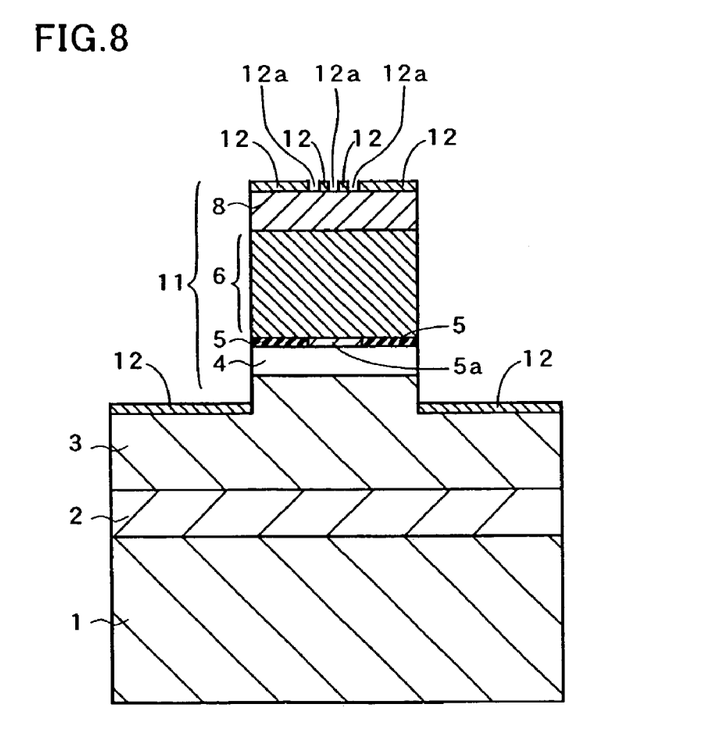
Figure 9:
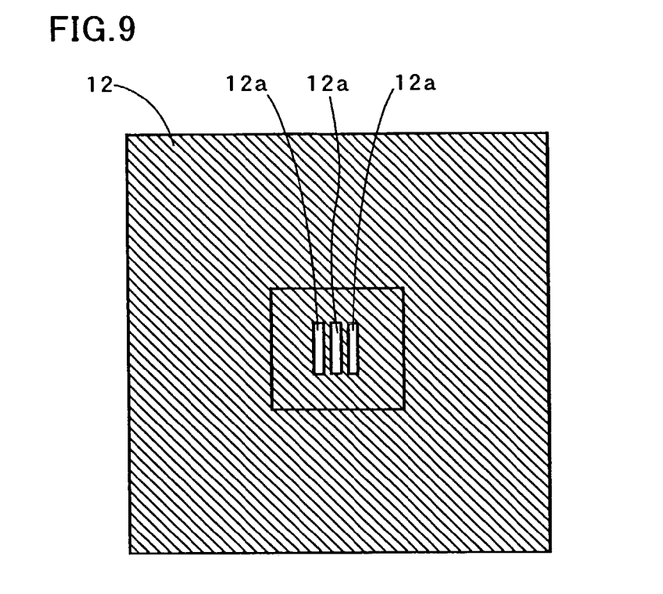
FIG. 9 is a plan view in the fabrication process shown in FIG. 8.

Then, a mask layer 12 of Ni for fine working is formed on the upper surface of the p-type GaAs contact layer 8 of the post portion 11 and the exposed upper surface of the n-type multi-layer reflector 3, as shown in FIG. 8. As shown in FIGS. 8 and 9, the mask layer 12 is provided with trenches 12a in the form of stripes each having a width of about 0.2 μm in a period of about 0.4 μm on a region of 4 μm square around the center of the upper surface of the post portion 11 along the <011> direction of the n-type GaAs (100) substrate 1.

Figure 10:
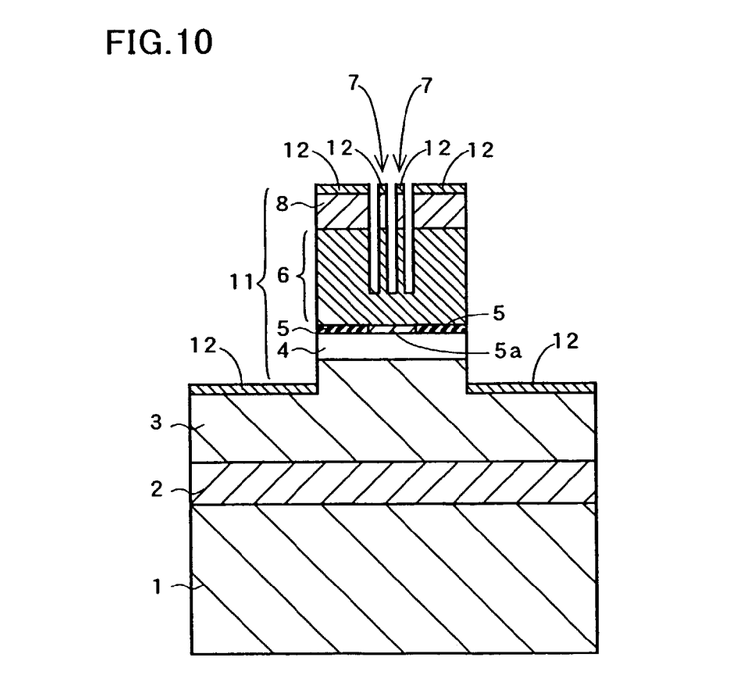
FIGS. 10 and 11 are sectional views for illustrating the fabrication process for the surface emission semiconductor laser device according to the embodiment of the present invention.

As shown in FIG. 10, etching is performed by RIBE through the mask layer 12, thereby forming the stripes 7 consisting of fine patterns having a depth not reaching the current blocking layer 5. In other words, the stripes 7 are formed with a prescribed depth not reaching the bottom of the p-type multi-layer reflector 6.

Figure 11:
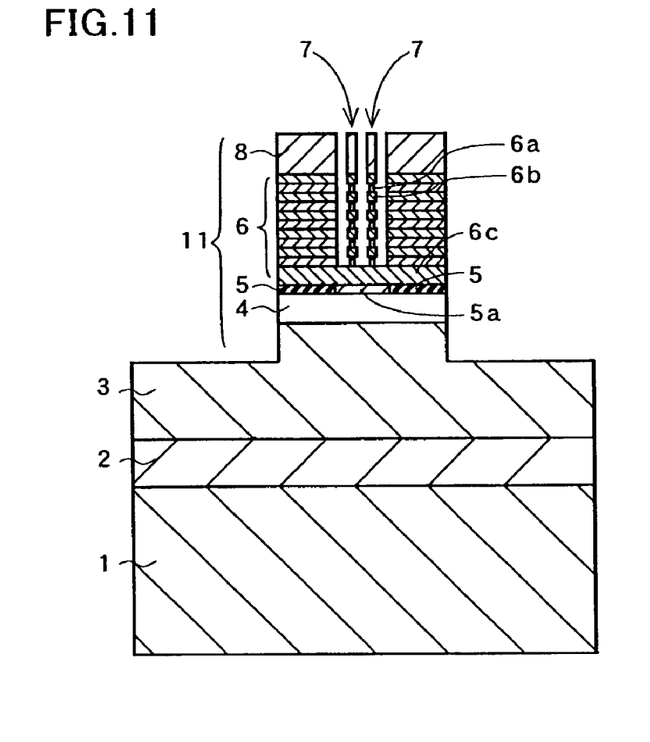

Thereafter only the $Al_{0.12}GaAs$ layers 6a forming the stripes 7 are selectively etched by a prescribed quantity with an ammonia-based etchant or tartaric acid. Thus, the p-type $Al_{0.12}GaAs$ layers 6a are formed to have the width W2 (see FIG. 3) of about 0.18 μm, as shown in FIG. 11. In this case, the p-type $Al_{0.9}GaAs$ layers 6b are formed so that the width W3 (see FIG. 3) thereof is about 0.2 μm.

Finally, the p-side ohmic electrode 9 is formed on the region of the p-type GaAs contact layer 8 excluding the stripes 7 while the n-side ohmic electrode 10 is formed on the back surface of the n-type GaAs (100) substrate 1, as shown in FIG. 1. The surface emission semiconductor laser device according to this embodiment is formed in the aforementioned manner.

Although the present invention has been described and illustrated in detail, it is clearly understood that the same is by way of illustration and example only and is not to be taken by way of limitation, the spirit and scope of the present invention being limited only by the terms of the appended claims.

For example, while the above embodiment has been described with reference to the emission layer 4 having the lasing wavelength of 850 nm, the present invention is not restricted to this but the emission layer 4 may alternatively have another lasing wavelength. An effect similar to the above can be attained also when the emission layer 4 has a lasing wavelength in the range of 750 nm to 870 nm, for example. In this case, it is necessary to adjust the thicknesses of the multi-layer reflectors 3 and 6 as well as the period and the width of the fine patterns of the stripes 7 formed on the post portion 11 according to the aforementioned principle.

While the emission layer 4 consisting of GaAs/AlGaAs is formed on the GaAs substrate 1 in the aforementioned embodiment, the present invention is not restricted to this but an emission layer consisting of AlGaInP may alternatively be formed on the GaAs substrate 1. Thus, a lasing wavelength of a red region in the range of 600 nm to 700 nm can be implemented. In this case, a multi-layer reflector may be formed by alternately stacking about 30 sets of $Al_{0.5}GaAs$ layers each having a thickness of about 49 nm and $Al_{0.95}GaAs$ layers each having a thickness of about 54 nm with respect to a lasing wavelength of 650 nm, for example.

Further alternatively, an emission layer consisting of InGaAs may be formed on the GaAs substrate 1. Thus, a lasing wavelength in the range of 850 nm to 1500 nm can be implemented. In this case, a multi-layer reflector may be formed by alternately stacking about 30 sets of $Al_{0.12}GaAs$ layers each having a thickness of about 69 nm and $Al_{0.9}GaAs$ layers each having a thickness of about 80 nm with respect to a lasing wavelength of 980 nm, for example.

While the emission layer 4 consisting of GaAs/AlGaAs is formed on the GaAs substrate 1 in the aforementioned embodiment, the present invention is not restricted to this but an emission layer consisting of GaInNAs may alternatively be formed on the GaAs substrate 1. Thus, a lasing wavelength in the range of 850 nm to 1500 nm can be obtained.

While the GaAs substrate 1 is employed in the aforementioned embodiment, the present invention is not restricted to this but another substrate such as an InP substrate may alternatively be employed, for example. In this case, a lasing wavelength in the range of 1.2 μm to 1.6 μm can be implemented by employing an emission layer consisting of InGaAsP. The emission layer may be formed by a nitride-based semiconductor layer consisting of AlGaN, InGaN or BInAlGaN or a ZnO layer having a wurtzite structure. Further, a mixed crystal semiconductor containing Be, Mg, Cd, Hg, Te, S or Se may be employed for the ZnO layer having a wurtzite structure. In addition, ZnSSe or CdSSe, which is a group 2–6 semiconductor having a wurtzite structure or a zinc blende crystal structure, may be employed as the material for the emission layer. A similar effect can be attained also when a mixed crystal semiconductor containing Be, Mg, Zn, Cd, Hg, S, Se or Te is employed for the group 2–6 semiconductor.

While the p-type multi-layer reflector 6 located on the MQW emission layer 4 is formed with the stripes 7 in the aforementioned embodiment, the present invention is not restricted to this but the n-type multi-layer reflector 3 located under the MQW emission layer 4 may alternatively be formed with stripes, to attain a similar effect.

Figure 12:
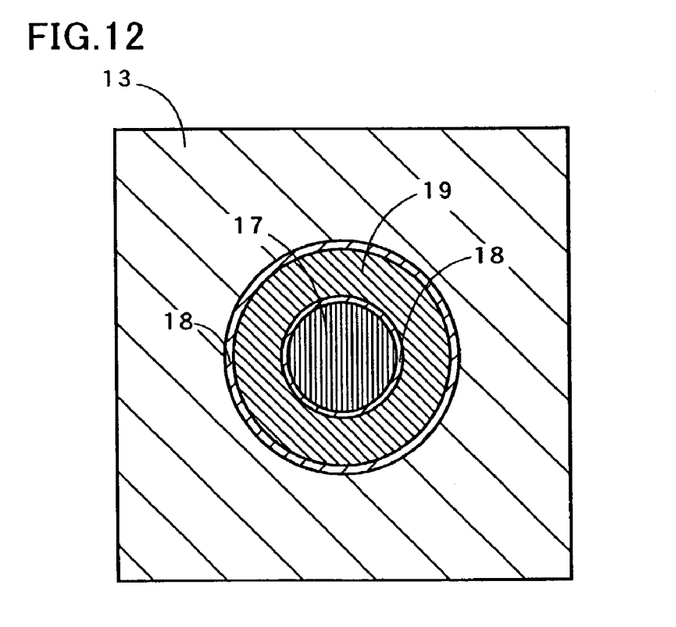
FIG. 12 is a plan view for illustrating the structure of a surface emission semiconductor laser device having a concentric laser beam emission shape according to a modification of the embodiment shown in FIGS. 1 and 2.

While the surface emission semiconductor laser device according to the aforementioned embodiment has an emission part having a quadrangular (square) shape in plane, the present invention is not restricted to this but the emission part may alternatively have another plane shape. For example, the surface emission semiconductor laser device may alternatively have a circular emission part in plane, as shown in a plan view of FIG. 12. In this case, a p-type contact layer 18 is formed on an n-type multi-layer reflector 13, and this p-type contact layer 18 is formed therein with stripes 17 worked in a prescribed period with a prescribed width. A p-side ohmic electrode 19 is formed on the p-type contact layer 18 excluding the upper surfaces of the stripes 17. The remaining structure of the surface emission semiconductor laser device shown in FIG. 12 is similar to that of the surface emission semiconductor laser device according to the aforementioned embodiment.

What is claimed is:

1. A surface emission semiconductor laser device comprising:
   a first multi-layer reflector;
   an emission layer formed on said first multi-layer reflector; and
   a second multi-layer reflector formed on said emission layer, wherein
   at least either said first multi-layer reflector or said second multi-layer reflector includes a striped part comprising a plurality of stripes having an elongated shape in a plan view and extending downwardly from above an upper surface of said multi-layer reflector and spaced apart by a prescribed period, wherein
   the striped part is formed on a region around the center of a pole-shaped post portion which is constituted by the first multi-layer reflector, the emission layer and the second multi-layer reflector.

2. The surface emission semiconductor laser device according to claim 1, wherein
   only said second multi-layer reflector includes said striped part.

3. The surface emission semiconductor laser device according to claim 2, wherein
   said striped part is formed on said second multi-layer reflector with a prescribed depth not reaching the bottom of said second multi-layer reflector.

4. The surface emission semiconductor laser device according to claim 1, wherein
   said stripes include a first material layer and a second material layer, and
   the refractive index of said first material layer and the refractive index of said second material layer with respect to polarization in a direction perpendicular to said striped part are substantially equal to each other.

5. The surface emission semiconductor laser device according to claim 4, wherein
   the ratio Wa between the width and the period of said striped part of said first material layer and the ratio Wb between the width and the period of said striped part of said second material layer are se set so that the refractive index of said first material layer and the refractive index of said second material layer with respect to polarization in said direction perpendicular to said striped part are substantially equal to each other.

6. The surface emission semiconductor laser device according to claim 5, wherein
   said ratios Wa and Wb are set so that the refractive index of said first material layer and the refractive index of said second material layer with respect to polarization in said direction parallel to said striped part are different from each other.

7. The surface emission semiconductor laser device according to claim 4, wherein
   the refractive index of said first material layer and the refractive index of said second material layer with respect to polarization in a direction parallel to said striped part are greater than the refractive index of said first material layer and the refractive index of said second material layer with respect to polarization in said direction perpendicular to said striped part.

8. The surface emission semiconductor laser device according to claim 4, wherein
   said first material layer and said second material layer consist of $Al_xGa_{1-x}As$ ($0 \leq x \leq 1$) having different Al compositions.

9. The surface emission semiconductor laser device according to claim 8, wherein said emission layer contains $Al_yGa_{1-x}As$ ($0 \leq x \leq 1$).

10. The surface emission semiconductor laser device according to claim 8, wherein
    said emission layer includes a single layer selected from a group consisting of an AlGaInP layer, an InGaAs layer, a GaInNAs layer, an InGaAsP layer and a nitride-based semiconductor layer.

11. The surface emission semiconductor laser device according to claim 4, wherein
    thicknesses t1 and t2 of said first material layer and said second material layer are set to satisfy $t1\,(t2) = \lambda/4/n1\,(n2)$ assuming that ni and n2 represent the refractive indices of said first material layer and said second material layer respectively and λ represents the lasing wavelength of said emission layer.

12. The surface emission semiconductor laser device according to claim 1, wherein said first multi-layer reflector, said emission layer and said second multi-layer reflector are formed on an n-type GaAs (100) substrate, and said striped part is formed to extend along the <011> direction of said n-type GaAs (100) substrate.

13. The surface emission semiconductor laser device according to claim 1, wherein a plurality of surface emission semiconductor laser devices each including said first multi-layer reflector, said emission layer and said second multi-layer reflector are formed on an n-type GaAs (100) substrate, and said striped parts of said plurality of surface emission semiconductor laser devices are formed to extend along the directions of different crystal axes of said n-type GaAs (100) substrate.

14. The surface emission semiconductor laser device according to claim 1, wherein said striped part is formed on a quadrangular region in plan view.

15. The surface emission semiconductor laser device according to claim 1, wherein said striped part is formed on a circular region in plan view.

16. The surface emission semiconductor laser device according to claim 1, wherein the period of said striped part is shorter than the emission wavelength of said emission layer.

* * * * *